United States Patent
Huang et al.

(10) Patent No.: US 12,047,069 B2
(45) Date of Patent: Jul. 23, 2024

(54) PARALLEL-TO-SERIAL CONVERSION CIRCUIT, PARALLEL-TO-SERIAL CONVERSION CIRCUIT LAYOUT, AND MEMORY

(71) Applicant: CHANGXIN MEMORY TECHNOLOGIES, INC., Hefei (CN)

(72) Inventors: Keqin Huang, Hefei (CN); Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 168 days.

(21) Appl. No.: 17/849,033

(22) Filed: Jun. 24, 2022

(65) Prior Publication Data

US 2023/0223940 A1 Jul. 13, 2023

Related U.S. Application Data

(63) Continuation of application No. PCT/CN2022/078110, filed on Feb. 25, 2022.

(30) Foreign Application Priority Data

Jan. 10, 2022 (CN) .......................... 202210023003.1

(51) Int. Cl.
*H03K 19/17736* (2020.01)
*G11C 16/04* (2006.01)
*H03K 19/173* (2006.01)

(52) U.S. Cl.
CPC ... *H03K 19/17744* (2013.01); *G11C 16/0425* (2013.01); *H03K 19/1737* (2013.01); *H03K 19/1774* (2013.01)

(58) Field of Classification Search
CPC ......... H03K 19/17744; H03K 19/1737; H03K 19/1774; G11C 16/0425; G11C 7/1066; G11C 2207/107; G11C 11/4093
See application file for complete search history.

(56) References Cited

U.S. PATENT DOCUMENTS

| | | | |
|---|---|---|---|
| 2006/0215468 A1* | 9/2006 | Anzai | G11C 7/106 365/196 |
| 2008/0123423 A1* | 5/2008 | Kim | G11C 7/1048 365/185.11 |
| 2022/0385287 A1* | 12/2022 | Park | H03K 19/20 |

FOREIGN PATENT DOCUMENTS

CN 112671414 A 4/2021

* cited by examiner

*Primary Examiner* — Seokjin Kim
(74) *Attorney, Agent, or Firm* — Kilpatrick Townsend & Stockton LLP

(57) ABSTRACT

A parallel-to-serial conversion circuit includes: parallel branches, each including first input end, second input end, control ends and output end, where the first input end is configured to receive high level signal, the second input end is configured to receive low level signal, the control ends are connected to selection unit and the output end is connected to a serial wire, and the selection unit is configured to receive selection signal and at least two branch signals, and is configured to select, based on the selection signal, one of the branch signals and transmit a selected branch signal to the parallel branch; the serial wire, configured to organize signals output by the parallel branches into a serial signal; and a drive unit, connected to the serial wire for enhancing drive capability of the serial wire, where an output end of the drive unit is configured to output the serial signal.

13 Claims, 11 Drawing Sheets

PARALLEL-TO-SERIAL CONVERSION CIRCUIT, PARALLEL-TO-SERIAL CONVERSION CIRCUIT LAYOUT, AND MEMORY

CROSS-REFERENCE TO RELATED APPLICATIONS

This application is a continuation of International Application No. PCT/CN2022/078110, filed on Feb. 25, 2022, which claims priority to Chinese Patent Application No. 202210023003.1, filed on Jan. 10, 2022. The disclosures of International Application No. PCT/CN2022/078110 and Chinese Patent Application No. 202210023003.1 are hereby incorporated by reference in their entireties.

BACKGROUND

For a parallel-to-serial conversion circuit in a memory, delays between respective parallel inputs and a serial output need to be maintained consistent with each other, and therefore, additional wrapping wires are needed in a circuit design, so that distances of connection lines from respective parallel inputs to the serial output are consistent with each other.

Similarly, for a serial-to-parallel conversion circuit in a memory, delays between a serial input and respective parallel outputs need to be maintained consistent with each other, and therefore, additional wrapping wires are needed in a circuit design, so that distances of connection lines from the serial input to respective parallel outputs are consistent with each other.

The additional wrapping wires of the conversion circuit increase a load of the conversion circuit, thereby reducing the performance of the conversion circuit; and a signal transmitted in a line with an excessive load has a small swing amplitude and a relatively large waveform duty cycle deviation, thereby easily causing a write/read error of the memory.

SUMMARY

The disclosure relates to the field of semiconductor circuit designs, and in particular, to a parallel-to-serial conversion circuit, a parallel-to-serial conversion circuit layout, and a memory.

Embodiments of the disclosure provide a parallel-to-serial conversion circuit, which includes: a plurality of parallel branches, each including a first input end, a second input end, control ends, and an output end, where the first input end is configured to receive a high level signal, the second input end is configured to receive a low level signal, the control ends are connected to a selection unit and the output end is connected to a serial wire, and the selection unit is configured to receive a selection signal and at least two branch signals, and is configured to select, based on the selection signal, one of the branch signals and transmit a selected branch signal to the parallel branch: the serial wire, configured to organize signals output by the plurality of parallel branches into a serial signal; and a drive unit, connected to the serial wire for enhancing drive capability of the serial wire, where an output end of the drive unit is configured to output the serial signal.

The embodiments of the disclosure provide a memory having a parallel-to-serial conversion circuit. The parallel-to-serial conversion circuit includes a plurality of parallel branches, each including a first input end, a second input end, control ends, and an output end, where the first input end is configured to receive a high level signal, the second input end is configured to receive a low level signal, the control ends are connected to a selection unit and the output end is connected to a serial wire, and the selection unit is configured to receive a selection signal and at least two branch signals, and is configured to select, based on the selection signal, one of the branch signals and transmit a selected branch signal to the parallel branch: the serial wire, configured to organize signals output by the plurality of parallel branches into a serial signal; and a drive unit, connected to the serial wire for enhancing drive capability of the serial wire, where an output end of the drive unit is configured to output the serial signal.

BRIEF DESCRIPTION OF THE DRAWINGS

One or more embodiments are exemplarily explained through pictures in the accompanying drawings corresponding thereto: these exemplary explanations do not constitute the limitations to the embodiments, and unless specifically stated, the pictures in the accompanying drawings do not constitute proportion limitations. To explain the technical solutions in the embodiments of the disclosure or the conventional technologies more clearly, the accompanying drawings required for describing the embodiments are briefly described hereinafter. Apparently, the accompanying drawings in the following description show merely some embodiments of the disclosure, and a person of ordinary skill in the art may also obtain other accompanying drawings from these accompanying drawings without creative efforts.

DETAILED DESCRIPTION

The additional wrapping wires of the conversion circuit increase a load of the conversion circuit, thereby reducing the performance of the conversion circuit; and a signal transmitted in a line with an excessive load has a small swing amplitude and a relatively large waveform duty cycle deviation, thereby easily causing a write/read error of the memory.

The embodiments of the disclosure provide a parallel-to-serial conversion circuit, which greatly reduces a load of a node in the conversion circuit, and effectively improves the performance of the node in the conversion circuit, so that the signal in the conversion circuit has a relatively great swing amplitude and a relatively small duty cycle loss.

Persons of ordinary skill in the art can understand that, in each embodiment of the disclosure, many technical details are proposed for a reader to better understand the disclosure. However, the technical solutions claimed by the disclosure can be realized, even without these technical details and various changes and modifications based on the following embodiments. The following divisions of various embodiments are for convenience of description, and should not constitute any limitation on the specific implementation of the disclosure, and the various embodiments may be combined with each other without contradiction.

Figure 1:
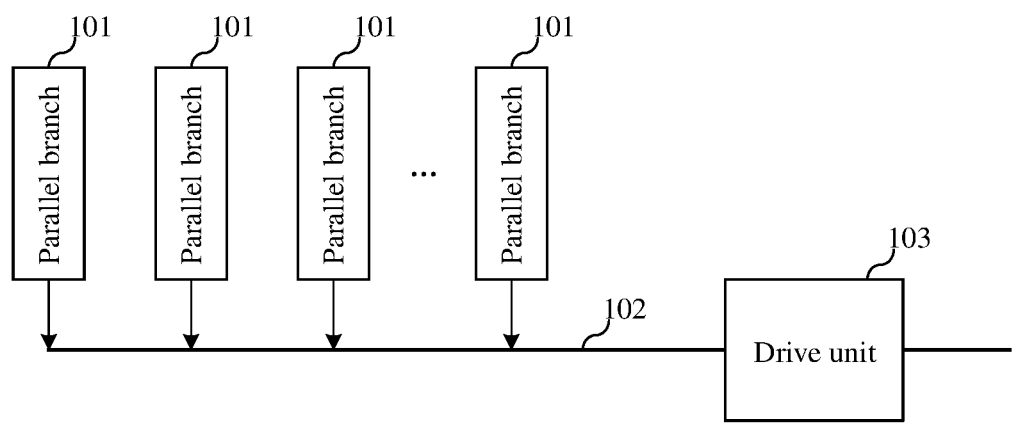
FIG. 1 is a schematic structural diagram of a parallel-to-serial conversion circuit provided by an embodiment of the disclosure.
Figure 2:
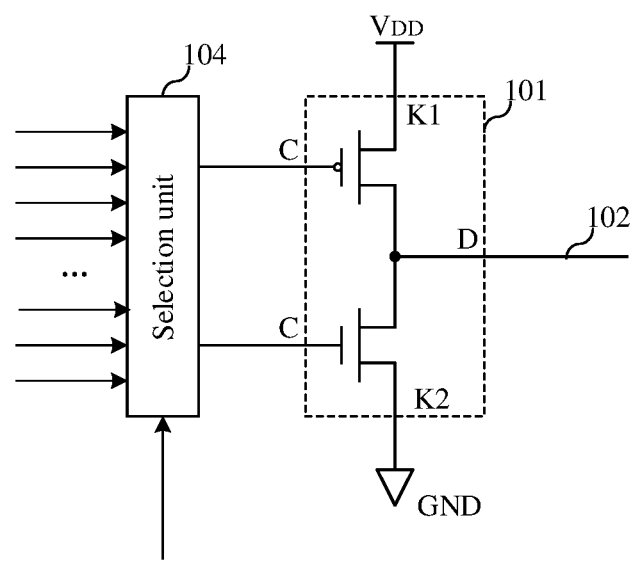
FIG. 2 is a schematic structural diagram of each parallel branch provided by an embodiment of the disclosure.
Figure 3:
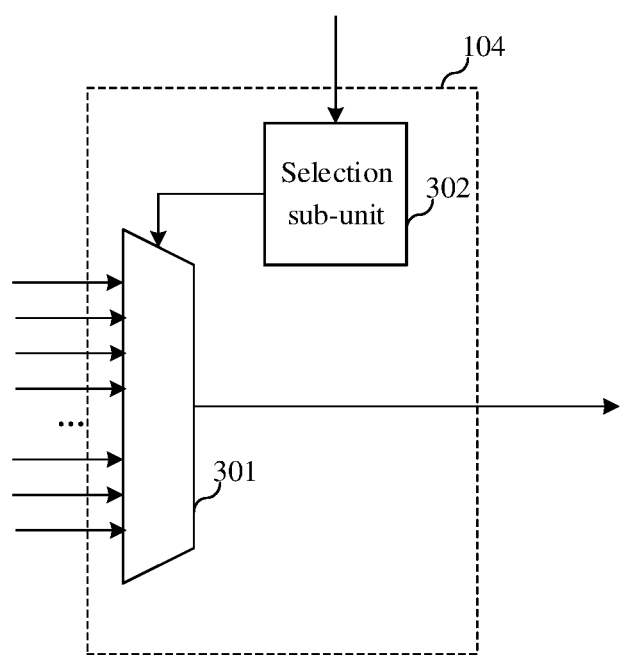
FIG. 3 is a schematic structural diagram of a selection unit provided by an embodiment of the disclosure.
Figure 4:
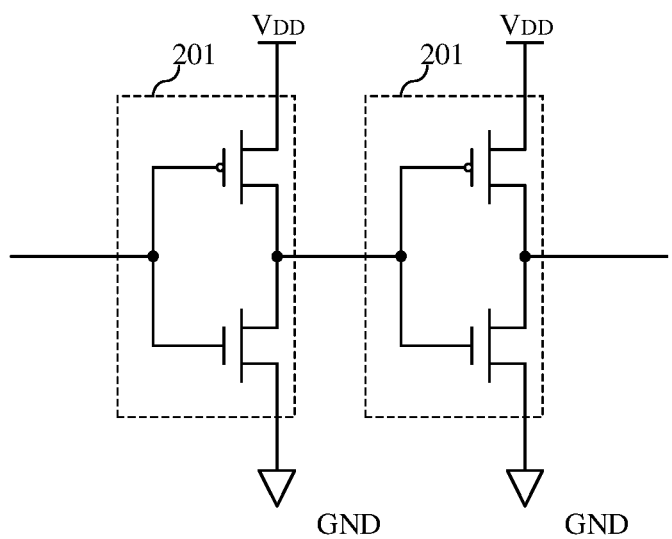
FIG. 4 is a schematic structural diagram of a drive unit provided by an embodiment of the disclosure.
Figure 5:
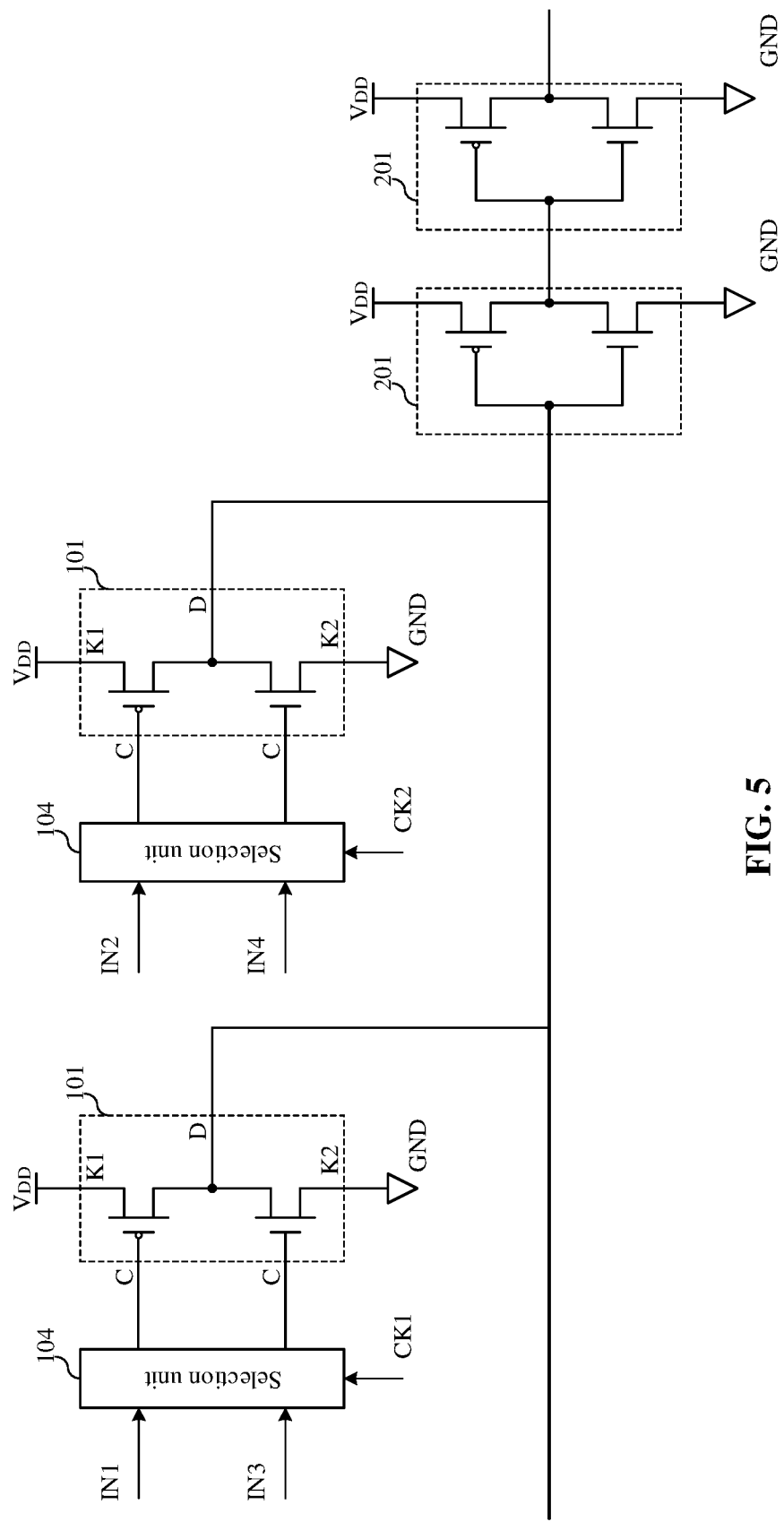
FIG. 5 is a schematic structural diagram of a parallel-to-serial conversion circuit of a structure component shown in FIG. 1 to FIG. 4 provided by an embodiment of the disclosure.
Figure 6:
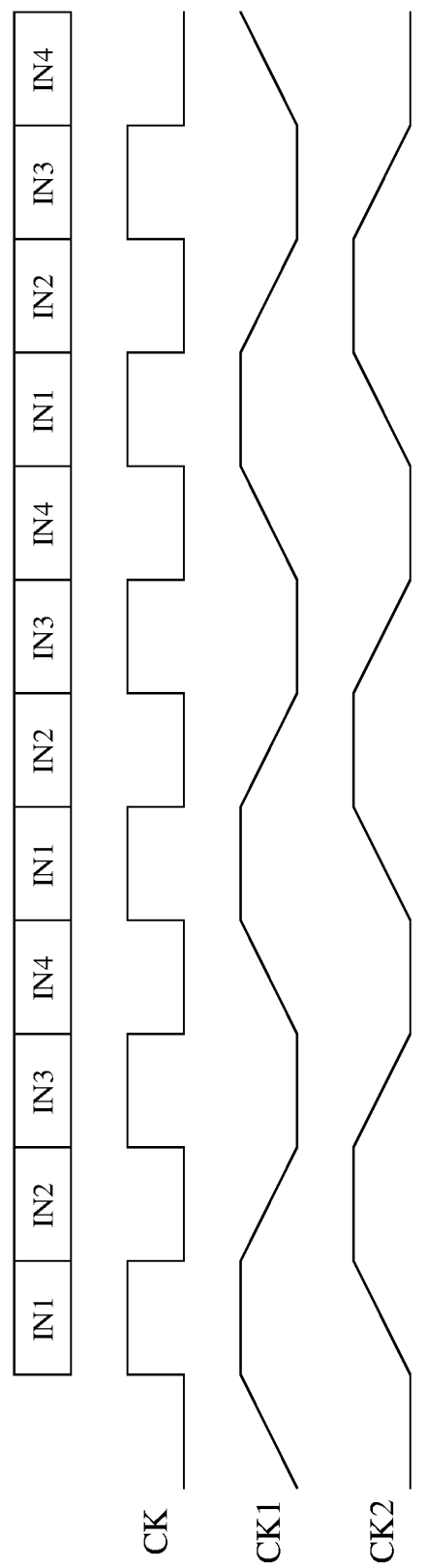
FIG. 6 is a schematic diagram of a waveform of a selection signal in the circuit shown in FIG. 5 provided by an embodiment of the disclosure.
Figure 7:
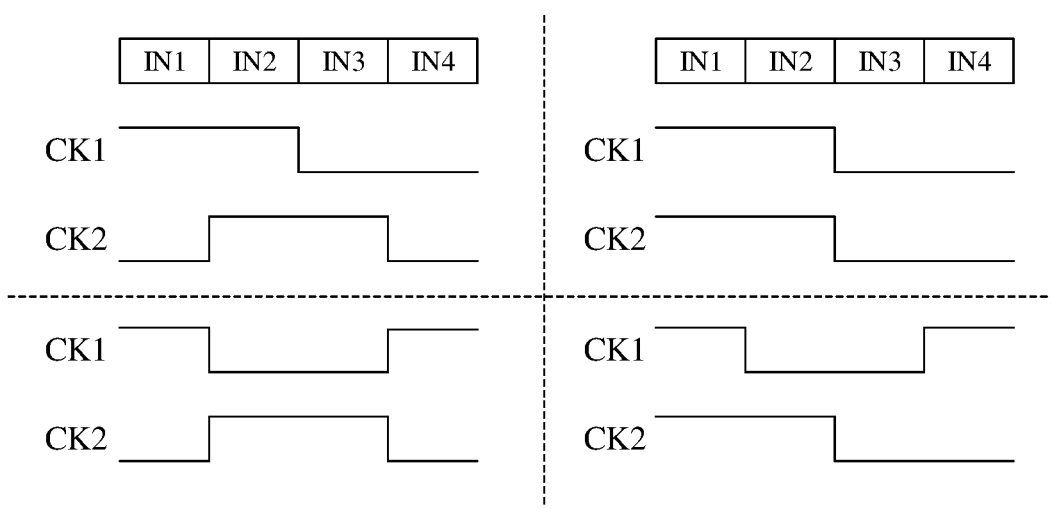
FIG. 7 is a specific waveform diagram of a selection signal in the circuit shown in FIG. 6 provided by an embodiment of the disclosure.

FIG. 1 is a schematic structural diagram of a parallel-to-serial conversion circuit provided by this embodiment; FIG. 2 is a schematic structural diagram of each parallel branch provided by this embodiment; and FIG. 3 is a schematic structural diagram of a selection unit provided by this embodiment. FIG. 4 is a schematic structural diagram of a drive unit provided by this embodiment. FIG. 5 is a schematic structural diagram of a parallel-to-serial conversion circuit of the structure component shown in FIG. 1 to FIG. 4 provided by this embodiment. FIG. 6 is a schematic diagram of a waveform of a selection signal in the circuit shown in FIG. 5 provided by this embodiment. FIG. 7 is a specific waveform diagram of a selection signal in the circuit shown in FIG. 6 provided by this embodiment. The parallel-to-serial conversion circuit provided by this embodiment is further explained in detail by combining the accompanying drawings, specifically:

With reference to FIG. 1, the parallel-to-serial conversion circuit includes a plurality of parallel branches 101, a serial wire 102, and a drive unit 103.

Specifically referring to FIG. 2, each parallel branch 101 includes a first input end K1, a second input end K2, control ends C, and an output end D: where the first input end K1 is configured to receive a high level signal $V_{DD}$, the second input end K2 is configured to receive a low level signal GND, the control ends C are connected to a selection unit 104, and the output end D is connected to a serial wire 102.

The selection unit 104 is configured to receive the selection signal and the at least two branch signals. The selection unit 104 is configured to select, based on the selection signal, one of the branch signals and transmit a selected branch signal to the parallel branch 101.

The serial wire 102 is configured to organize signals output by the plurality of parallel branches 101 into a serial signal.

The drive unit 103 is connected to the serial wire 102, for enhancing drive capability of the serial wire 102, where an output end of the drive unit 103 is used for outputting the serial signal.

Each parallel branch 101 receives, through the selection unit 104, multiple parallel signals, and the received multiple parallel signals are subjected to data selection through the selection signal. It is thus possible to implement the transmission of the multiple parallel signals through the single parallel branch 101, so as to save the number of the parallel branches 101 required to be arranged, which further saves the length of the serial wire 102 required to be arranged, thereby reducing the load of the serial wire 102. In addition, by saving the number of the parallel branches 101, an area of the layout occupied by some parallel branch layouts is saved, so as to reduce a layout area of the parallel-to-serial conversion circuit, thereby implementing integration to a larger extent. In addition, by saving the number of the parallel branches 101, the layout layers of the parallel branches 101 are saved, thereby reducing the layout layer height of the parallel-to-serial conversion circuit.

Further referring to FIG. 2, each parallel branch 101 includes: a switch PMOS transistor and a switch NMOS transistor: where a gate of the switch PMOS transistor and a gate of the switch NMOS transistor are used as the control ends C of the parallel branch 101 for connecting the selection unit 104: a source of the switch PMOS and the drain of the switch NMOS transistor are connected to the serial wire 102: a drain of the switch PMOS transistor is used as the first input end K1 of the parallel branch 101 for receiving a high level signal $V_{DD}$: a drain of the switch NMOS transistor is used as the second input end K2 of the parallel branch 101 for receiving a low level signal GND.

A gate of the switch PMOS transistor and a gate of the switch NMOS transistor are both used as the control ends C, so that only one of the switch PMOS transistor and the switch NMOS transistor can be turned on based on the parallel signal output by the selection unit 104. When the switch PMOS transistor is turned on, the serial wire 102 is connected to a high level signal $V_{DD}$, to output one high level signal: when the switch NMOS transistor is turned on, the serial wire 102 is connected to a low level signal GND, to output one low level signal.

It should be explained that in the embodiment of the disclosure, the received low level signal GND through grounding, and the high level signal $V_{DD}$ through the internal power source voltage do not constitute the limitations to this embodiment. In other embodiments, any power source signal that can be recognized as high level by the memory can be selected to provide the high level signal: similarly, any power source signal that can be recognized as low level by the memory can be selected to provide the low level signal.

In addition, for the switch PMOS transistor and the switch NMOS transistor, the specific connection mode of the "source" and "drain" does not constitute the limitations to this embodiment; in other embodiments, a connection mode of replacing a "source" by a "drain" and replacing a "drain" by a "source" can be adopted.

In addition, using the drain of the switch PMOS transistor as the first input end K1 and using the drain of the switch NMOS transistor as the second input end K2 do not constitute the limitations to this embodiment: in other embodiments, the drain of the switch PMOS transistor can be used as the second input end K2, and the drain of the switch NMOS transistor can be used as the first input end K1: in this case, when the switch PMOS transistor is turned on, the serial wire 102 is connected to the low level signal GND, to output one low level signal; when the switch NMOS transistor is turned on, the serial wire 102 is connected to the high level signal $V_{DD}$, to output one high level signal.

In some embodiments, with reference to FIG. 3, the selection unit 104 includes a multiplexer 301 and a selection sub-unit 302.

The multiplexer 301 is configured to receive the at least two branch signals, and be connected to the selection sub-unit 302.

The selection sub-unit 302 is configured to receive a selection command and generate a selection signal based on the selection command: and the multiplexer 301 is configured to select, based on the selection signal, one of the branch signals and transmit the selected branch signal to the parallel branch 101 through the control end C.

In some embodiments, with reference to FIG. 4, the drive unit 103 includes: two inverters, where an input end of one of the inverters is connected to the serial wire 102, and an output end of the inverter is connected to an input end of the other inverter; and an output end of the other inverter is configured to output the serial signal.

Further referring to FIG. 4, the inverter includes: a drive PMOS transistor and a drive NMOS transistor; a gate of the drive PMOS transistor is connected to a gate of the drive NMOS transistor; a source of the drive PMOS transistor is connected to a drain of the drive NMOS transistor; a drain of the drive PMOS transistor is configured to receive a high level signal $V_{DD}$: a source of the drive NMOS transistor is configured to receive a low level signal GND.

The gate of the drive PMOS transistor is connected to the gate of the drive NMOS as the input end of the inverter: when the high level is input, the drive NMOS transistor is turned on and the output end of the inverter is connected to the low level signal GND, to output low level data: when the low level is input, the drive PMOS transistor is turned on and the output end of the inverter is connected to the high level signal $V_{DD}$, to output high level data, so as to implement data inversion. In addition, the output high level data is the high level signal $V_{DD}$, and the output low level data is the low level signal GND, so as to increase the swing amplitude of the signal and reduce the duty cycle loss of the signal.

In an example, if the branch signals received by the selection unit 104 are two, i.e., the multiplexer 301 only receives two of branch signals, the circuit shown in FIG. 5 is formed in combination with the circuits of FIG. 1 to FIG. 4.

In the example of the disclosure, the selection command may select the internal clock signal CK, and in other examples, the selection command may adopt an external signal as a command for control.

The example in FIG. 5 takes the parallel-to-serial conversion circuit having 2 parallel branches as an example for specific introduction, and does not limit the number of the parallel branches in the parallel-to-serial conversion circuit.

Specifically, a period of the selection signal corresponding to each selection unit 104 generated according to the selection command is n times of a period of the internal clock signal, and n is a branch number of the parallel branches 101 in the parallel-to-serial conversion circuit. Hence, in this example, the period of the selection signal is twice of the period of the internal clock signal; in other embodiments, if the branch number of the parallel branches in the parallel-to-serial conversion circuit is n, the period of the selection signal corresponding to each selection unit generated according to the selection command is n times of a period of the internal clock signal.

Specifically referring to FIG. 6, each of a period of the first selection signal CK1 for first parallel branch control and a period of the second selection signal CK2 for second parallel branch control is twice of the period of the internal clock signal CK.

It should be explained that, oblique lines shown in the signal diagram of the first selection signal CK1 and the second selection signal CK2 may be high level and may also be low level, and therefore, 4 groups of first selection signals CK1 and second selection signals CK2 shown in FIG. 7 can be formed.

Referring to the third group of level distributions in FIG. 7, it can be known that in the selection signals received by the selection units 104 connected to the plurality of parallel branches 101, the high levels are alternately distributed. Referring to the first, second, and fourth groups of level distributions in FIG. 7, it can be known that in the selection signals received by the selection units 104 connected to the plurality of parallel branches 101, the high levels have an overlapped part.

Referring to FIG. 6, the first selection signal CK1 is used for controlling outputs of the first branch signal IN1 and the third branch signal IN3; and the second selection signal CK2 is used for controlling outputs of the second branch signal IN2 the fourth branch signal IN4.

Specifically, when the CK1 is at high level, the first branch signal IN1 controls, through the selection unit 104, the parallel branch 101 to input the high level signal $V_{DD}$ or the low level signal GND into the serial wire 102; when the CK2 is at high level, the second branch signal IN2 controls, through the selection unit 104, the parallel branch 101 to input the high level signal $V_{DD}$ or the low level signal GND into the serial wire 102: when the CK1 is at low level, the first branch signal IN1 controls, through the selection unit 104, the parallel branch 101 to input the high level signal $V_{DD}$ or low level signal GND into the serial wire 102: when the CK2 is at low level, the second branch signal IN2 controls, through the selection unit 104, the parallel branch 101 to input the high level signal $V_{DD}$ or low level signal GND into the serial wire 102.

It should be explained that to avoid influences of signals of other parallel branches, at most one of the selection signal and the branch signal connected to a same selection unit is a continuous signal, so that when other parallel branches are working, the switch PMOS transistor or switch NMOS transistor in other parallel branches would not be turned on, and other parallel branches would not influence the signals in the serial wire 102.

In an example, the first selection signal CK1 and the second selection signal CK2 are disconnected signals, i.e., the level of the oblique lines shown in FIG. 6 is null. In an example, the branch signals IN1, IN2, IN3, and IN4 transmitted to the selection unit are disconnected signals. In this case, when the first selection signal CK1 and the second selection signal CK2 are effective signals, the branch signals IN1, IN2, IN3 and IN4 have effective level. In an example, the selection signal and the branch signal are both disconnected signals, and the effective levels of the selection signal and the branch signal are overlapped.

In other examples, each parallel branch is configured to receive more than two branch signals, for example, a mode where circuit units are embedded and connected as shown in FIG. 5 is used to implement reception of more than two branch signals by the parallel branches: or using each selection unit to receive more than two branch signals may also implement reception of more than two branch signals by the parallel branches.

In the embodiments of the disclosure, each parallel branch receives, through the selection unit, multiple parallel signals: the received multiple parallel signals are subjected to data selection through the selection signal. It is thus possible to implement the transmission of the multiple parallel signals through the single parallel branch, so as to save the number of the parallel branches required to be arranged, which further saves the length of the serial wire required to be arranged, thereby reducing the load of the serial wire. In addition, by saving the number of the parallel branches, an area of the layout occupied by some parallel branch layouts is saved, so as to reduce a layout area of the parallel-to-serial conversion circuit, thereby implementing integration to a larger extent. In addition, by saving the number of the parallel branches, the layout layers of the parallel branches are saved, thereby reducing the layout layer height of the parallel-to-serial conversion circuit.

It should be explained that the features disclosed in the parallel-to-serial conversion circuit provided by the embodiments can be combined arbitrarily without conflict to obtain new embodiments of the parallel-to-serial conversion circuit.

Another embodiment of the disclosure provides a parallel-to-serial conversion circuit layout, for forming the parallel-to-serial conversion circuit provided by the embodiments above. By saving the number of the parallel branches, an area of the layout occupied by some parallel branch layouts is saved, so as to reduce a layout area of the parallel-to-serial conversion circuit, thereby implementing integration to a larger extent. In addition, by saving the number of the parallel branch layouts, the layout layers of the parallel branch layouts are saved, thereby reducing the layout layer height of the parallel-to-serial conversion circuit layouts. By symmetrically arranging the layout layers where the parallel branch layouts are disposed with respect to the layout layer where the drive unit layout is disposed, it is possible to maintain delays between respective parallel inputs and the serial output to be consistent with each other.

Figure 8:
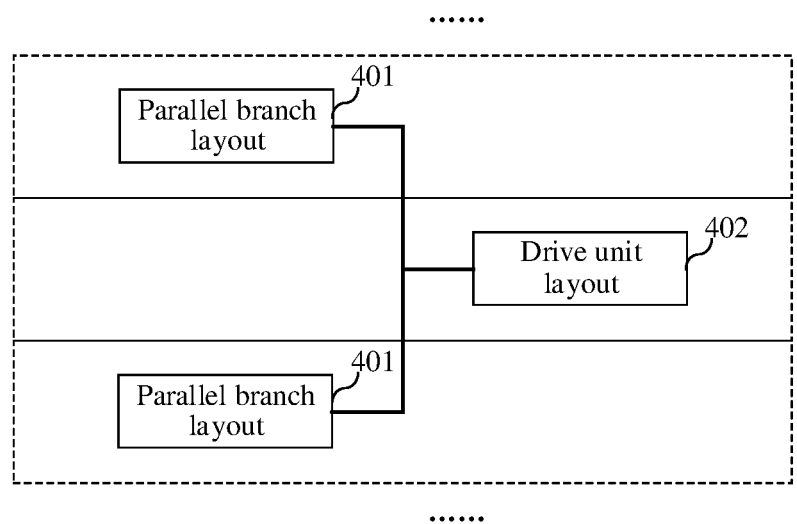
FIG. 8 and FIG. 9 are schematic structural diagrams of a parallel-to-serial conversion circuit layout having two parallel branches provided by another embodiment of the disclosure.
Figure 9:
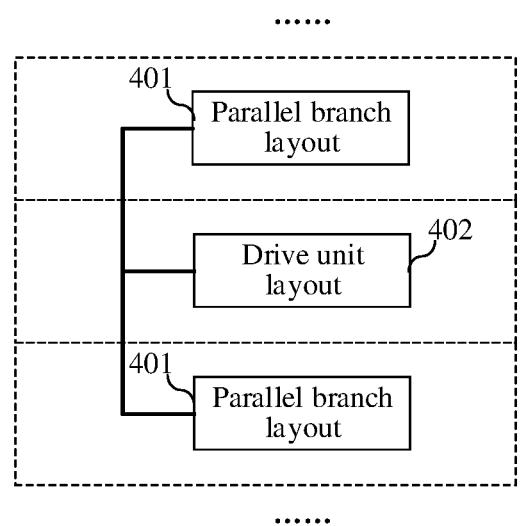
Figure 10:
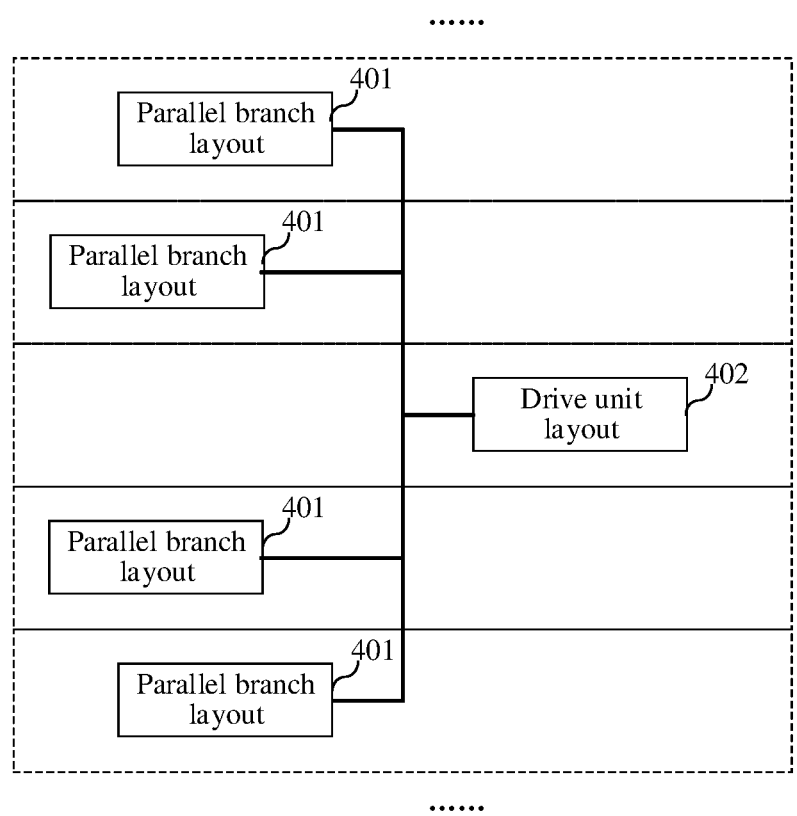
FIG. 10 and FIG. 11 are schematic structural diagrams of a parallel-to-serial conversion circuit layout having four parallel branches provided by a further embodiment of the disclosure.
Figure 11:
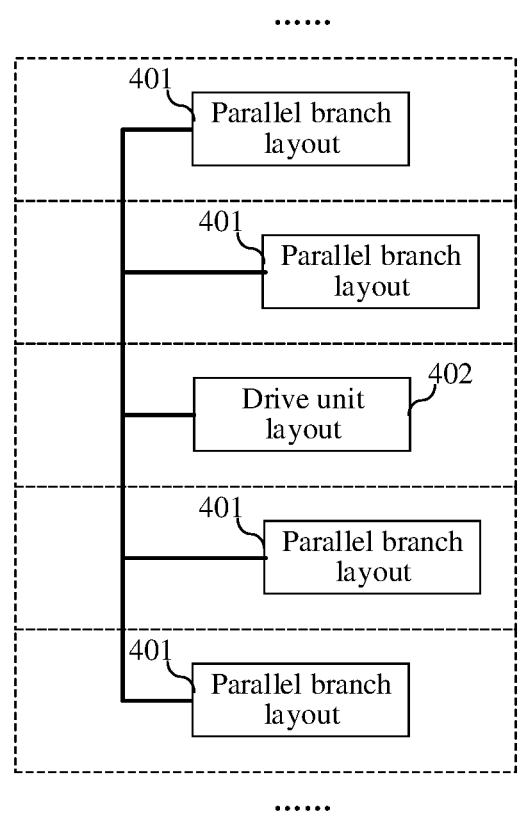

FIG. 8 and FIG. 9 are schematic structural diagrams of a parallel-to-serial conversion circuit layout having two parallel branches provided by an embodiment. FIG. 10 and FIG. 11 are schematic structural diagrams of a parallel-to-serial conversion circuit layout having four parallel branches provided by an embodiment. The parallel-to-serial conversion circuit layout provided by the embodiment is further explained in detail in combination with respective accompanying drawings.

With reference to FIG. 8 and FIG. 9, the parallel-to-serial conversion circuit layout includes:

parallel branch layouts 401, each configured to form the parallel branch, and form the selection unit connected to the parallel branch; and a drive unit layout 402, configured to form the drive unit, where each parallel branch layout 401 and drive unit layout 402 are disposed in different layout layers, and the layout layers where the plurality of parallel branch layouts 401 are disposed are symmetrically arranged with respect to the layout layer where the drive unit layout 402 is disposed: the serial wires connecting the parallel branch layouts 401 and the drive unit layout 402 are symmetrically arranged with respect to the layout layer where the drive unit layout is disposed. By symmetrically arranging the layout layers where the parallel branch layouts 401 are disposed with respect to the layout layer where the drive unit layout 402 is disposed, it is possible to maintain delays between respective parallel inputs and the serial output to be consistent with each other.

By saving the number of the parallel branches, an area of the layout occupied by some parallel branch layouts 401 is saved, so as to reduce a layout area of the parallel-to-serial conversion circuit, thereby implementing integration to a larger extent. In addition, by saving the number of the parallel branch layouts 401, the layout layers of the parallel branch layouts 401 are saved, thereby reducing the layout layer height of the parallel-to-serial conversion circuit layouts.

In an example, referring to FIG. 8, the projections of the parallel branch layouts 401 and the drive unit layout 402 in a direction perpendicular to the layout layers are not overlapped, i.e., the parallel branch layouts 401 and the drive unit layout 402 are arranged along different directions of the layout layers.

In an example, referring to FIG. 9, the projections of the parallel branch layouts 401 and the drive unit layout 402 in a direction perpendicular to the layout layers are partially overlapped, i.e., the parallel branch layouts 401 and the drive unit layout 402 are arranged along a same direction of the layout layers, so as to further save an area of the layout of the parallel-to-serial conversion circuit.

The parallel-to-serial conversion circuit including two parallel branches 101 or four parallel branches 101 is taken as an example in an embodiment to specifically explain the parallel-to-serial conversion circuit layout.

Referring to FIG. 8 and FIG. 9, the drive unit layout 402 is disposed at a position in a middle layout layer of the parallel-to-serial conversion circuit. Since the delays between respective parallel inputs and the serial output need to be maintained consistent with each other, i.e., the parallel branch layouts 401 disposed at two sides of the drive unit layout 402 and having an equal distance to the layout layer where the drive unit layout 402 is disposed are arranged symmetrically; and in an extension direction perpendicular to the layout layers, the projections of the two symmetrically arranged parallel branch layouts 401 on the layout layer are overlapped, so as to implement that the lengths of the serial wires connecting the parallel branch layouts 401 and the drive unit layout 402 are equal.

Referring to FIG. 10 and FIG. 11, the drive unit layout 402 is disposed at a position in a middle layout layer of the parallel-to-serial conversion circuit. Since the delays between respective parallel inputs and the serial output need to be maintained consistent with each other, the lengths of the serial wires in the layout layers of the parallel branch layouts 401 disposed at a same side of the drive unit layout 402 are gradually reduced as the increasing of distances between respective layout layers where the parallel branch layouts 401 are disposed and the layout layer where the drive unit layout 402 is disposed, so as to meet the condition that the lengths of the serial wires connecting the parallel branch layouts 401 and the drive unit layout 402 disposed at the same side of the parallel branch layouts 401 are equal. The parallel branch layouts 401 disposed at two sides of the drive unit layout 402 and having an equal distance to the layout layer where the drive unit layout 402 is disposed are symmetrically arranged, and in an extension direction perpendicular to the layout layers, the projections of the two symmetrically arranged parallel branch layouts 401 on the layout layer are overlapped, so as to implement that the lengths of the serial wires connecting the parallel branch layouts 401 and the drive unit layout 402 are equal.

It should be explained that when the number of the parallel branches 101 in the parallel-to-serial conversion circuit is greater than 4, the layout thereof is constructed based on the layout shown in FIG. 10 and FIG. 11, to meet the condition that the lengths of all serial wires connecting the parallel branch layout 401 and the drive unit layout 402 are equal.

In should be explained that the description above about the parallel-to-serial conversion circuit layout is similar to the description of the parallel-to-serial conversion circuit embodiment, and the parallel-to-serial conversion circuit layout has the same beneficial effect as the parallel-to-serial conversion circuit embodiment, which is therefore omitted for clarity. For technical details that are not disclosed in the parallel-to-serial conversion circuit layout of the embodiments of the disclosure, reference can be made to the description of the parallel-to-serial conversion circuit in the embodiments of the disclosure for understanding.

Another embodiment of the disclosure provides a memory. The memory adopts the parallel-to-serial conversion circuit of the embodiment above or the layout framework of the memory adopts the parallel-to-serial conversion circuit layout for construction.

In some embodiments, the memory is a Dynamic Random Access Memory (DRAM) chip, where an internal storage of the DRAM chip meets a DDR2 internal storage specification.

In some embodiments, the memory is a DRAM chip, where an internal storage of the DRAM chip meets a DDR3 internal storage specification.

In some embodiments, the memory is a DRAM chip, where an internal storage of the DRAM chip meets a DDR4 internal storage specification.

In some embodiments, the memory is a DRAM chip, where an internal storage of the DRAM chip meets a DDR5 internal storage specification.

Those skilled in the art can understand that the various embodiments above are specific embodiments for implementing the disclosure, and in practical applications, they can be changed in form and detail without deviating from the spirit and scope of the disclosure.

The invention claimed is:

1. A parallel-to-serial conversion circuit, comprising:
a plurality of parallel branches, each comprising a first input end, a second input end, control ends and an output end,
wherein the first input end is configured to receive a high level signal, the second input end is configured to receive a low level signal, the control ends are connected to a selection unit, and the output end is connected to a serial wire, and
wherein the selection unit is configured to receive a selection signal and at least two branch signals, and configured to select, based on the selection signal, one of the at least two branch signals and transmit a selected branch signal to a parallel branch of the plurality of parallel branches;
the serial wire, configured to organize signals output by the plurality of parallel branches into a serial signal; and
a drive unit, connected to the serial wire, for enhancing drive capability of the serial wire, wherein an output end of the drive unit is configured to output the serial signal;
wherein the selection unit comprises a multiplexer and a selection sub-unit,
wherein the multiplexer is configured to only receive two branch signals of the at least two branch signals, and the multiplexer is configured to be connected to the selection sub-unit;
wherein the selection sub-unit is configured to receive a selection command and generate the selection signal based on the selection command, and the selection command is an internal clock signal; and
wherein the multiplexer is configured to select, based on the selection signal, one of the two branch signals and transmit the selected branch signal to the parallel branch through one of the control ends.

2. The parallel-to-serial conversion circuit of claim 1, wherein a period of the selection signal is n times of a period of the internal clock signal, and n is a branch number of the plurality of parallel branches.

3. The parallel-to-serial conversion circuit of claim 1, wherein at most one of the selection signal or a branch signal of the at least two branch signals received by a same selection unit is a continuous signal.

4. The parallel-to-serial conversion circuit of claim 1, wherein in the selection signals received by the selection units connected to the plurality of parallel branches, high levels are alternately distributed.

5. The parallel-to-serial conversion circuit of claim 1, wherein in the selection signals received by the selection units connected to the plurality of parallel branches, high levels have an overlapped part.

6. The parallel-to-serial conversion circuit of claim 1, wherein each parallel branch of the plurality of parallel branches comprises a switch Positive-channel Metal-Oxide-Semiconductor (PMOS) transistor and a switch Negative-channel Metal-Oxide-Semiconductor (NMOS) transistor,
wherein a gate of the switch PMOS transistor and a gate of the switch NMOS transistor are used as the control ends of the parallel branch for connecting the selection unit;
a source of the switch PMOS transistor and a drain of the switch NMOS transistor are connected to the serial wire;
a drain of the switch PMOS transistor is used as the first input end of the parallel branch for receiving the high level signal; and
a source of the switch NMOS transistor is used as the second input end of the parallel branch for receiving the low level signal.

7. The parallel-to-serial conversion circuit of claim 1, wherein the drive unit comprises two inverters, wherein an input end of a first inverter of the two inverters is connected to the serial wire, and an output end of the first inverter is connected to an input end of a second inverter of the two inverters; and an output end of the second inverter is configured to output the serial signal.

8. The parallel-to-serial conversion circuit of claim 7, wherein the first inverter or the second inverter comprises a drive Positive-channel Metal-Oxide-Semiconductor (PMOS) transistor and a drive Negative-channel Metal-Oxide-Semiconductor (NMOS) transistor,
wherein a gate of the drive PMOS transistor is connected to a gate of the drive NMOS transistor, and a source of the drive PMOS transistor is connected to a drain of the drive NMOS transistor; and
a drain of the drive PMOS transistor is configured to receive the high level signal, and a source of the drive NMOS transistor is configured to receive the low level signal.

9. A parallel-to-serial conversion circuit layout, configured to form the parallel-to-serial conversion circuit of claim 1, the parallel-to-serial conversion circuit layout comprising
parallel branch layouts, each configured to form the parallel branch, and form the selection unit connected to the parallel branch; and
a drive unit layout, configured to form the drive unit,
wherein each of the parallel branch layouts and the drive unit layout are disposed in different layout layers; and
layout layers where the parallel branch layouts are disposed are symmetrically arranged with respect to a layout layer where the drive unit layout is disposed; and the serial wires connecting the parallel branch layouts and the drive unit layout are symmetrically arranged with respect to the layout layer where the drive unit layout is disposed.

10. The parallel-to-serial conversion circuit layout of claim 9, wherein projections of the parallel branch layouts and the drive unit layout in a direction perpendicular to the layout layers are partially overlapped.

11. The parallel-to-serial conversion circuit layout of claim 9, wherein projections of the parallel branch layouts and the drive unit layout in a direction perpendicular to the layout layers are not overlapped.

12. A memory having a parallel-to-serial conversion circuit, wherein the parallel-to-serial conversion circuit comprises:

a plurality of parallel branches, each comprising a first input end, a second input end, control ends and an output end, wherein the first input end is configured to receive a high level signal, the second input end is configured to receive a low level signal, the control ends are connected to a selection unit, and the output end is connected to a serial wire, and wherein the selection unit is configured to receive a selection signal and at least two branch signals, and configured to select, based on the selection signal, one of the at least two branch signals and transmit a selected branch signal to a parallel branch of the plurality of parallel branches;

the serial wire, configured to organize signals output by the plurality of parallel branches into a serial signal; and a drive unit, connected to the serial wire, for enhancing drive capability of the serial wire, wherein an output end of the drive unit is configured to output the serial signal;

wherein the selection unit comprises a multiplexer and a selection sub-unit, wherein the multiplexer is configured to only receive two branch signals of the at least two branch signals, and the multiplexer is configured to be connected to the selection sub-unit;

wherein the selection sub-unit is configured to receive a selection command and generate the selection signal based on the selection command, and the selection command is an internal clock signal; and wherein the multiplexer is configured to select, based on the selection signal, one of the two branch signals and transmit the selected branch signal to the parallel branch through one of the control ends.

13. A memory using the parallel-to-serial conversion circuit layout of claim 9 in a layout framework of the memory.

* * * * *